(12) United States Patent
Haberland et al.

(10) Patent No.: US 8,545,266 B2
(45) Date of Patent: Oct. 1, 2013

(54) PLUG CONNECTIONS ON RADAR SENSORS AND METHOD FOR THEIR PRODUCTION

(75) Inventors: Udo Haberland, Holzgerlingen (DE); Urs Luebbert, Bietigheim-Bissingen (DE); Patrick Pfitzenmaier, Besigheim (DE)

(73) Assignee: VALEO Schalter und Sensoren GmbH, Bietigheim-Bissingen (DE)

( * ) Notice: Subject to any disclaimer, the term of this patent is extended or adjusted under 35 U.S.C. 154(b) by 191 days.

(21) Appl. No.: 13/131,059

(22) PCT Filed: Dec. 10, 2009

(86) PCT No.: PCT/EP2009/008850
§ 371 (c)(1),
(2), (4) Date: May 25, 2011

(87) PCT Pub. No.: WO2010/066434
PCT Pub. Date: Jun. 17, 2010

(65) Prior Publication Data
US 2011/0237128 A1    Sep. 29, 2011

(30) Foreign Application Priority Data
Dec. 13, 2008    (DE) .................. 10 2008 062 190

(51) Int. Cl.
*H01R 13/648*    (2006.01)
(52) U.S. Cl.
USPC ................................ 439/607.03; 264/272.14

(58) Field of Classification Search
USPC ....... 439/607.03, 607.02, 620.01; 264/272.14
See application file for complete search history.

(56) References Cited

U.S. PATENT DOCUMENTS

| 3,599,210 A | | 8/1971 | Stander | |
|---|---|---|---|---|
| 4,641,907 A | * | 2/1987 | Althouse et al. | 439/607.03 |
| 4,806,124 A | * | 2/1989 | Bowlin | 439/607.03 |
| 6,123,584 A | * | 9/2000 | Van Koetsem et al. | 439/607.02 |
| 7,959,466 B2 | * | 6/2011 | Ju | 439/607.03 |

FOREIGN PATENT DOCUMENTS

| DE | 33 11 001 C2 | 7/1994 |
|---|---|---|
| EP | 1 469 552 A2 | 10/2004 |
| EP | 1 471 598 A1 | 10/2004 |
| GB | 2 181 898 A | 4/1987 |

OTHER PUBLICATIONS

International Search Report issued in PCT/EP2009/008850, mailed on Mar. 31, 2010, with translation, 4 pages.

* cited by examiner

*Primary Examiner* — Hae Moon Hyeon
(74) *Attorney, Agent, or Firm* — Osha Liang LLP

(57) ABSTRACT

Plug connections on radar sensors include plug pins which are inserted into plastic. The plastic that surrounds the plug pins is at least partially provided with a granulate that absorbs radar waves, such that the electrical impedance of the plastic has a high value in low-frequency range, and the plastic comprises a characteristic which absorbs radar waves in a region of higher-frequency radar waves. The plug pins are surrounded by a thin layer of plastic without radar-absorbent granulate, and a remainder of an area surrounding the plug pins includes the plastic with the granulate which absorbs radar waves.

10 Claims, 2 Drawing Sheets

PLUG CONNECTIONS ON RADAR SENSORS AND METHOD FOR THEIR PRODUCTION

PRIOR ART

The invention relates to plug connections on radar sensors and to a method for their production, of the generic type of the main claim and of the method claim.

It is normal practice in the case of plug connections for the plug pins of a plug part to first of all be embedded in an insulating material, preferably plastic, and then to be inserted as a so-called insert into a customer-specific plug connection. By way of example, an insert such as this can be placed as an insert part into a mould, and can then be injection moulded into a corresponding housing. In this case, the insert which has previously been insert-moulded and the housing are generally composed of the same material.

When using plastic, it is also known per se for a plastic to be used which is absorbent in the frequency range of the radar waves (for example 24 GHz) in the region of radar sensors, in order to decouple the radar sensor from the near area and the surrounding area. For example, EP 1 471 598 A1 discloses a foam-like plastic to be used for covering such radar sensors, to which a granulate which absorbs radar waves is added. A specific plastic such as this minimizes the influence of interference which is caused by, for example, metallic parts in the vicinity of the radar sensor. This plastic which is therefore known and absorbs radio-frequency waves is, however, in general used only as a holder and otherwise for screening in the area of the radar sensors.

DESCRIPTION OF THE INVENTION

The invention is based on plug connections on radar sensors having plug pins which are inserted into plastic, in which, according to the invention, the plastic which surrounds the plug pins is advantageously at least partially provided with a granulate which absorbs radar waves, such that the electrical impedance of the plastic between the plug pins has a high value in the low-frequency range, and the plastic has a characteristic which absorbs radar waves in the region of higher-frequency radar waves.

In this case, the plug pins are advantageously directly surrounded by a thin layer of plastic without radar-absorbent granulate, and the rest of the area surrounding the plug pins consists of the plastic with the granulate which absorbs radar waves. A plastic such as this which absorbs radar waves and is preferably provided with graphite components may, for example, have an electrical conductivity of about 10 k$\Omega$/cm in one embodiment, which is known per se. By way of example, when using a 2.54 mm grid, the distance between the plug pins may be about 1.9 mm, resulting in an electrical resistance value between two plug pins of about 2.5 k$\Omega$. The invention now means that the plug pins do not come into contact with the radar-absorbent plastic, and the electrical resistance between the plug pins has therefore been greatly increased by the additional insulation layer. The plastic for the additional insulation layer may, as a base material, be the same as that of the radar-absorbent material, but without the conductive additives, such as graphite.

In order to allow a simple and low-cost production method, it is also advantageous to insert the plug pins over a large area into an electrically insulating plastic bed in an insert, and to spray the plastic with the granulate which absorbs radar waves around this plastic bed.

A method according to the invention for production of plug connections of the type described above allows electrical contact to be made easily with a radar sensor, and the plug pins can be injection-moulded into a housing. In a first method step, for example, the plug pins are insert-moulded with the plastic which is electrically non-conductive or poorly conductive and, in a second method step, the plug pins which have been pretreated in this way are insert-moulded with the plastic which absorbs radar waves.

By way of example, in addition, the plug pins can be joined together to form an insert and, in the first method step (initial insert-moulding) can be insert-moulded with the electrically non-conductive or poorly conductive plastic, and the insert can then be inserted into a mould for production of a housing, in which it is injection-moulded or insert-moulded with the plastic which absorbs radar waves.

As an alternative to this, the plug pins can also just as well be inserted into a mould for production of a housing and can be insert-moulded with the electrically non-conductive or poorly conductive plastic in the first method step in the course of a two-component method, and the rest of the housing is then sprayed or filled with the plastic which absorbs radar waves. It is also possible for the plug pins to already be coated in an electrically insulating manner before being introduced into an insert or into a mould for production of a housing.

According to one advantageous use of the plug connections according to the invention, the plug connections can be fitted to a motor vehicle, in a housing for a radar sensor for a surrounding-area identification system.

BRIEF DESCRIPTION OF THE DRAWING

One exemplary embodiment of the invention will be explained with reference to the figures of the drawing, in which.

APPROACH TO IMPLEMENTATION OF THE INVENTION

Figure 1:
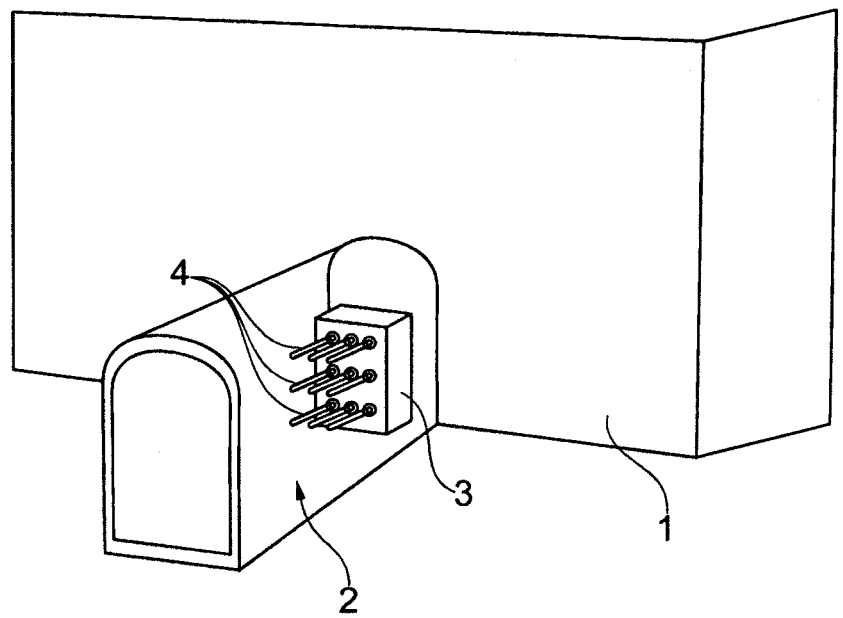
FIG. 1 shows a view of a housing of a radar sensor with electrical plug connections.

FIG. 1 shows a housing 1 for a radar sensor, as is used by way of example in automobile technology for fitting to the bumper bar of a vehicle for a surrounding-area identification system. The housing 1 is fitted with plug connections 2 via which electrical contact, which is not shown in any more detail here, can be made between the electrical components of the radar sensor and a line system or bus system which continues further in the vehicle.

In this case, the plug connections 2 are provided with an insert 3 as a previously insert-moulded plastic component, which is fitted with a predetermined number of plug pins 4.

Figure 2:
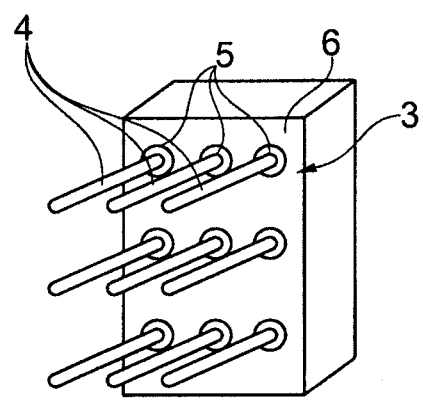
FIG. 2 shows a detail view of an insert with the plug pins of the plug connections as shown in FIG. 1, with an electrically insulating plastic layer and a plastic layer which absorbs radar waves.

FIG. 2 now shows in detail how the plug pins 4 in the insert 3 are surrounded with a thin layer of a plastic 5 without radar-absorbent granulate, and the rest of the area surrounding the plug pins, that is to say the body of the insert 3, is composed of a plastic 6 with the granulate, preferably graphite, which absorbs radar waves. The plug pins 4 are therefore not connected to the radar-absorbent plastic 6, as a result of which the electrical resistance between the plug pins 4 has been greatly increased and, at the same time, the radar-absorbent characteristics of the housing 1 have also been maintained in the area of the plug connections 2.

Figure 3:
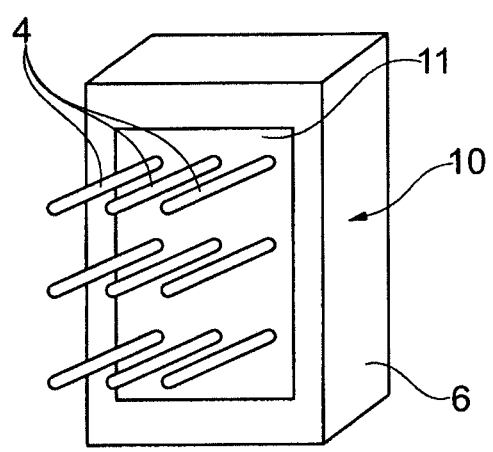
FIG. 3 shows a detail view of an insert with the plug pins of the plug connections as shown in FIG. 1, with a different embodiment of an electrically insulating plastic layer and a plastic layer which absorbs radar waves.

FIG. 3 shows an exemplary embodiment in which an insert 10 is designed such that the plug pins 4 are inserted over a large area into an electrically insulating plastic bed 11. The plastic 6 with the granulate which absorbs radar waves is then sprayed around this plastic bed 11.

The invention claimed is:

1. Plug connections on radar sensors, comprising:
   plug pins which are inserted into plastic,
   wherein the plastic which surrounds the plug pins is at least partially provided with a granulate which absorbs radar waves, such that the electrical impedance of the plastic has a high value in low-frequency range, and the plastic comprises a characteristic which absorbs radar waves in a region of higher-frequency radar waves, and
   wherein the plug pins are surrounded by a thin layer of plastic without radar-absorbent granulate, and a remainder of an area surrounding the plug pins comprises the plastic with the granulate which absorbs radar waves.

2. The plug connections according to claim 1, wherein the remainder of the area surrounding the plug pins in an insert comprises the plastic with the granulate which absorbs radar waves.

3. The plug connections according to claim 2, wherein the thin layer makes up a fraction of the distance between the plug pins.

4. The plug connections according to claim 1, wherein an insert is designed such that the plug pins are inserted over a large area into an electrically insulating plastic bed, and such that the plastic around the plastic bed is sprayed with the granulate which absorbs radar waves.

5. The plug connections according to claim 1, wherein the plastic which absorbs radar waves is provided with a granulate composed of graphite components.

6. The plug connections according to claim 1, wherein the plug connections are fitted to a motor vehicle, in a housing for a radar sensor for a surrounding-area identification system.

7. A method for production of plug connections on radar sensors, the plug connections comprising plug pins which are inserted into plastic, wherein the plastic which surrounds the plug pins is at least partially provided with a granulate which absorbs radar waves, such that the electrical impedance of the plastic has a high value in low-frequency range, and the plastic comprises a characteristic which absorbs radar waves in a region of higher-frequency radar waves, and wherein the plug pins are surrounded by a thin layer of plastic without radar-absorbent granulate, and a remainder of an area surrounding the plug pins comprises the plastic with the granulate which absorbs radar waves, the method comprising:
   insert-moulding the plug pins with a plastic which is electrically non-conductive or poorly conductive to obtain pretreated plug pins; and
   insert-moulding the pretreated plug pins with a plastic which absorbs radar waves.

8. The method for production of plug connections according to claim 7, further comprising:
   joining the plug pins together to form an insert;
   insert-moulding the insert with the electrically non-conductive or poorly conductive plastic; and
   inserting the insert into a mould for production of a housing, in which the insert is injection-moulded or insert-moulded with the plastic which absorbs radar waves.

9. The method for production of plug connections according to claim 7, further comprising:
   inserting the plug pins into a mould for production of a housing and;
   insert-moulding, with an electrically non-conductive or poorly conductive plastic, the plug pins; and
   filling a remainder of the housing with the plastic which absorbs radar waves.

10. The method for production of plug connections according to claim 7, wherein the plug pins are coated in an electrically insulating manner before being introduced into an insert or into a mould for production of a housing.

* * * * *